United States Patent [19]

Tsang et al.

[11] 4,435,809
[45] Mar. 6, 1984

[54] PASSIVELY MODE LOCKED LASER HAVING A SATURABLE ABSORBER

[75] Inventors: Won-Tien Tsang, New Providence; Jan P. van der Ziel, Short Hills, both of N.J.

[73] Assignee: Bell Telephone Laboratories, Incorporated, Murray Hill, N.J.

[21] Appl. No.: 302,028

[22] Filed: Sep. 14, 1981

[51] Int. Cl.$^3$ .............................................. H01S 3/19
[52] U.S. Cl. ...................................... 372/49; 372/18; 372/20; 357/17; 357/19
[58] Field of Search .................................... 372/43–49, 372/18–20, 9; 357/17, 19

[56] References Cited

U.S. PATENT DOCUMENTS 3,654,497  4/1972  Dyment et al. ...................... 307/312
4,325,034  4/1982  Dyment et al. ....................... 357/17

OTHER PUBLICATIONS

Ziel et al., "Subpicosecond Pulses from Passively Mode-Locked GaAs Buried Optical Guide Semiconductor Lasers", App. Phys. Lett. 39(7), Oct. 1, 1981, pp. 525–527.

H. Matsumura, et al., *Journal of Applied Physics*, "Electrical Measurement of the Lateral Spread of the Proton Isolation Layer in GaAs", vol. 48, No. 7, Jul. 1977, pp. 2779–2783.

J. P. van der Ziel, et al., *J. Appl. Phys.*, "Mode Locking of Strip Buried Heterostructure (AlGa)As Lasers Using an External Cavity, " vol. 51 (6), Jun. 1980, pp. 3033–3037.

E. P. Ippen, et al., *Appl. Phys. Lett.*, "Picosecond Pulse Generation by Passive Mode Locking of Diode Lasers," vol. 37 (3), Aug. 1, 1980, pp. 267–269.

Eleventh International Quantum Electronics Conf., paper W.3.

*Primary Examiner*—William L. Sikes
*Assistant Examiner*—Léon Scott, Jr.
*Attorney, Agent, or Firm*—Richard D. Laumann

[57] ABSTRACT

A region of saturable absorption is produced in semiconductor lasers by proton bombardment and results in subpicosecond optical pulses.

9 Claims, 4 Drawing Figures

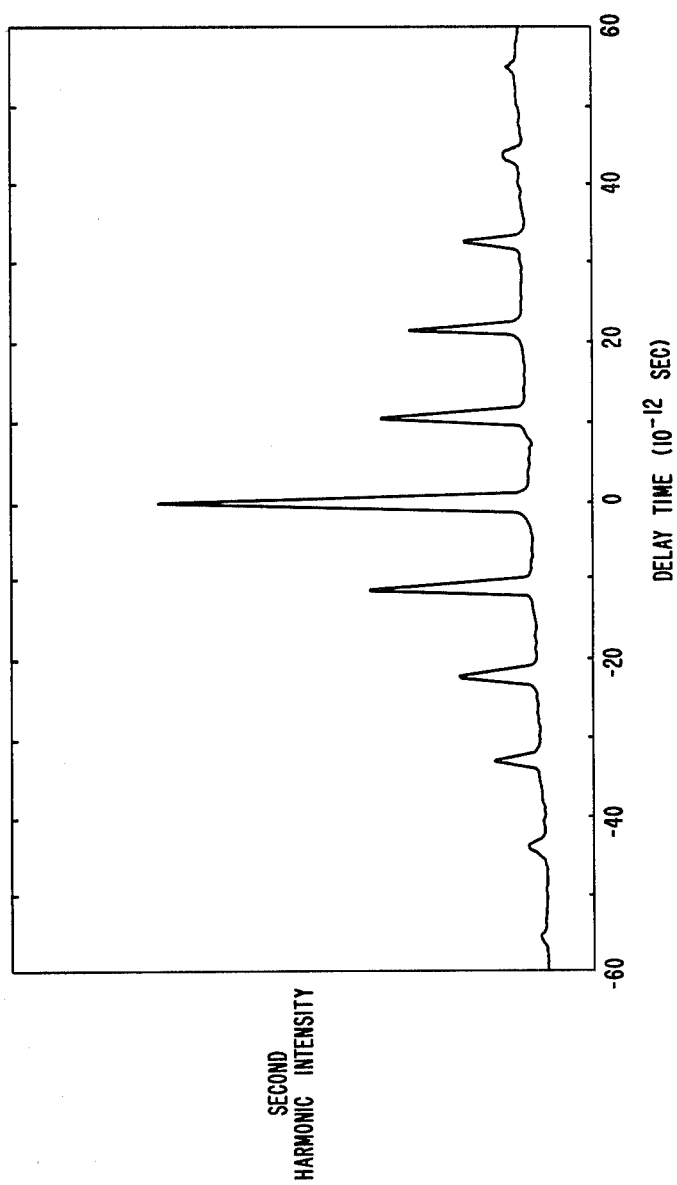

PASSIVELY MODE LOCKED LASER HAVING A SATURABLE ABSORBER

TECHNICAL FIELD

This invention relates generally to semiconductor lasers and particularly to semiconductor lasers containing a region of saturable absorption that is produced by, for example, proton bombardment.

BACKGROUND OF THE INVENTION

The generation of very short, for example, several picoseconds or less, pulses of coherent optical radiation is currently an area of technological interest. Such pulses would be useful in diverse practical applications such as high-speed optoelectronic devices and optical communication systems using extremely high data rates.

Several approaches have been taken in the attempt to produce very short optical pulses. One approach is mode locking in which a laser produces periodic pulses with a repetition rate related to the round-trip pulse transit time within the cavity. Both active and passive mode locking of diode lasers has been achieved. The former technique uses elements such as acousto-optic modulators to produce mode locking. The elements are, however, generally too slow to permit the attainment of the limiting pulse width.

Passive mode locking has achieved short pulse widths and it is believed that a saturable absorption region is required to obtain the shortest possible pulses. For example, a modified strip buried heterostructure AlGaAs diode laser with an external lens and mirror produced pulses having a duration of approximately 5.1 psec. See, for example, *Applied Physics Letters*, 37, pp. 267–269, Aug. 1, 1980. The shortest pulses reported were observed with diode lasers that had been aged until there was a noticeable increase in threshold current due to the development of dark line defects. It was hypothesized that the short pulse length was due, at least in part, to a saturable absorption loss produced as the aging process introduced dark line defects that caused saturable absorption. With strip buried heterostructure lasers that contain defects that were hypothesized to act as saturable absorbers, pulses as short as 1.3 psec were reported at the Eleventh International Quantum Electronics Conference, paper W.3., Boston, Mass., June 23-26, 1980.

Both of these reported lasers suffer drawbacks. For example, the concentration of what were believed to be saturable absorbers in the lasers increased with age and was therefore somewhat uncontrolled and variable. This, of course, led to devices having characteristics that changed significantly with time. Further, the presence of dark line defects resulted in accelerated degradation and failure of the lasers. Furthermore, since devices capable of generating still shorter pulses and having stable device characteristics are desirable, devices having a carefully controlled, i.e., stable with respect to time, saturable absorber region suitable for generating subpicosecond optical pulses and being introduced into the laser in a controlled and nondestructive manner are desirable.

SUMMARY OF THE INVENTION

We have found that subpicosecond optical pulses may be generated with a semiconductor laser passively mode locked by a saturable absorber region in the active layer of the laser and which is produced in a controlled and nondestructive manner. In a preferred embodiment, the active layer of the laser comprises a saturable absorber region, adjacent the exit face of the laser, which is conveniently produced by proton bombardment. The saturable absorption region introduced by proton bombardment has the advantages of not degrading with aging and having a controlled number of defects. In a preferred embodiment, the laser comprises an active layer, two cladding layers on opposed surfaces of the active layer having refractive indices lower than that of the active layer, and a saturable absorption region adjacent the exit face formed by proton bombardment with at least a $3 \times 10^{15}$ cm$^{-2}$ proton dosage level. The laser may further comprise an external cavity which comprises a mirror and lens to collimate the light. The region adjacent the laser face that is not irradiated with protons may be coated with an antireflection coating such as a $\lambda/4$ layer of $SiO_2$ to reduce the Fabry-Perot mode structure.

BRIEF DESCRIPTION OF THE DRAWINGS

FIG. 4 shows the second harmonic autocorrelation pulses for a passively mode locked laser of this invention.

DETAILED DESCRIPTION

Figure 1:
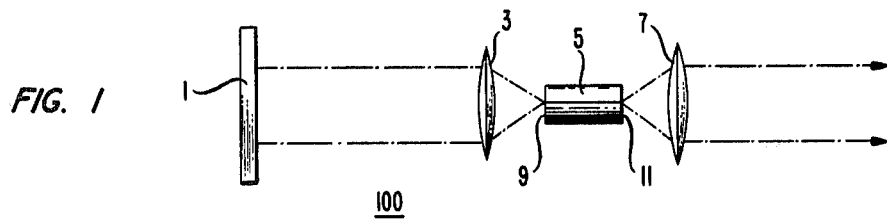
FIG. 1 is a schematic representation of a passive mode locked laser of this invention.

For reasons of clarity and convenience, the elements of the device are not drawn to scale in the Figures. FIG. 1 is a schematic representation of a passive mode locked laser of this invention. The device is indicated generally as 100 and comprises mirror 1, lens 3, laser 5, output lens 7, an antireflection coating 9, and a saturable absorber region 11. Antireflection coating 9 is formed on one exit face of the laser and the saturable absorber region is in the active layer and adjacent the opposed face of the laser. The light rays are indicated by the dashed lines. The mirror 1 and lens 3 comprise the external cavity. The interior laser-air face, which is not irradiated with protons, has an antireflection coating such as a $\lambda/4$ layer of $SiO_2$ that is formed by well-known techniques. The antireflection reduces the laser Fabry-Perot mode structure. The lens, such as a microlens, collimates the light. The lens and the mirror spacing and orientation are adjusted, by well-known techniques, so that the emission from the antireflection coated face is reinjected into the active region. The length of the optical cavity depicted is approximately 15 cm, which corresponds to a round-trip transit time of approximately $10^{-9}$ sec.

Variations in the depicted structure are possible. The lens may be omitted with the result that more of the optical energy will be lost from the cavity due to the laser beam divergence. This results in an increased current threshold. Other external cavity configurations are possible. For example, an optical fiber having a reflective mirror coated at one end and a lens which is an integral part of the fiber at the other end may be used. The external cavity may also be omitted. This will produce short pulses, and permit direct modulation of the output without an external cavity.

The mode locking and, thus, the ultrashort pulses are obtained by having the saturable absorber region desirably in the active layer near one end of the laser cavity, i.e., adjacent the exit face. Other locations, e.g., the middle of the active layer, are possible but may lead to multiple pulses. The saturable absorption region is produced by a technique, such as proton bombardment, that produces nonradiative traps in the bandgap. The pulse width is controlled by both the width, w, and degree of saturable absorption within this region. The minimum length of the saturable absorption region is approximately 3 $\mu$m, and the length of the region is desirably between 6 $\mu$m and 50 $\mu$m.

Standard techniques, such as the technique described in *Journal of Applied Physics,* 48, pp. 2779-2783, July 1977, may be used to create the saturable absorber region by proton bombardment of the device. For example, 600 keV protons have a range of approximately 6 $\mu$m in GaAs, and carrier diffusion will reduce the carrier density for several additional $\mu$m. As a result, the nonlinear region will extend for approximately 8 to 10 $\mu$m from the exit face when the incident proton beam is parallel to the active layer. The round-trip transit time through the nonlinear region having these approximate dimensions is between 0.23 and 0.29 psec and is, as will be discussed later, less than half the measured pulse width. It is desirable that the region behind the mirror at the exit face be the saturable absorber region for minimum pulse width. If desired, both ends may be proton bombarded. Alternatively, the incident proton beam could be perpendicular to the active layer. This is the preferred technique if it is desired that the saturable absorber region be at a position other than adjacent one of the exit faces. The proton dosage level is desirably between $3 \times 10^{15}$ and $10^{16}/cm^2$. Lower values are undesirable because there is insufficient saturable absorption and higher values are undesirable because it is too difficult to saturate the absorber region and the current threshold becomes too high. The proton bombardment produces absorption through the creation of nonradiative traps within the energy gap as well as a highly resistive region which limits current injection.

Figure 2:
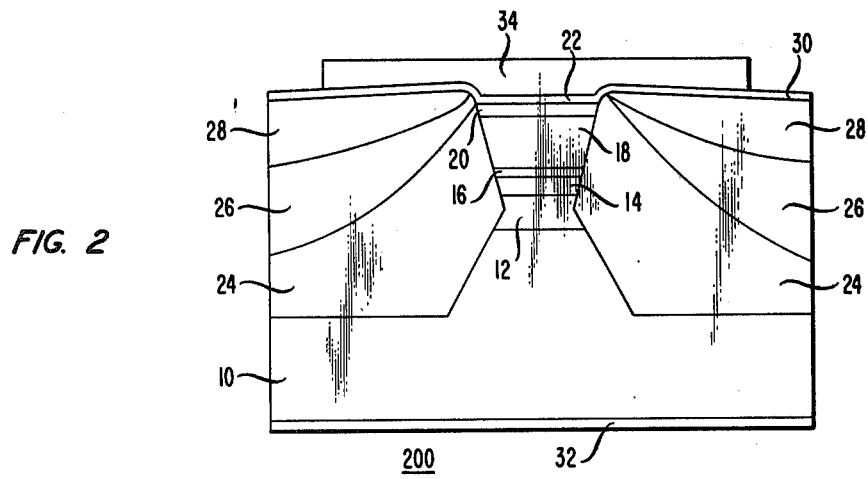
FIG. 2 is a schematic representation of a cross-sectional view of a laser of this invention.

A cross-sectional view of a laser of this invention is shown in FIG. 2. The laser, indicated generally as 200, is a buried optical guide laser and comprises substrate 10, first cladding layer 12, first guiding layer 14, active layer 16, second cladding layer 18, layer 20, current confining layers 24, 26, and 28, ohmic contacts 30 and 32, and gold pad 34. The first cladding and first guiding layers have a first conductivity type, while the second cladding layer has a second conductivity type. Current confining layers 24 and 28 have a second conductivity type while current confining layer 26 has a first conductivity type. The active layer may have either conductivity type and further comprises a saturable absorber region. Layer 20 is a highly doped layer which aids device processing through better adhesion of ohmic contact 32. In the embodiment shown, the first conductivity type was n-type, and the second conductivity type was p-type. The active layer was p-type. The substrate was n-type gallium arsenide. The active layer had the composition $Al_{0.08}Ga_{0.92}As$ and was 0.2 $\mu$m thick. The active layer has a retractive index greater than that of the guiding layer. Useful active layer compositions include $Al_xGa_{1-x}As$, x less than or equal to 0.08. The first and second cladding layers had the composition $Al_{0.36}Ga_{0.64}As$, and were 2.0 $\mu$m and 1.5 $\mu$m thick, respectively, and the first guiding guiding layer had the composition $Al_{0.2}Ga_{0.8}As$ and a thickness of 1.0 $\mu$m. The current confining layers had the composition $Al_{0.6}Ga_{0.35}As$. The optical cavity was formed by the guiding and active layers.

The structure may be grown by liquid phase epitaxy processes that are well known to those working in the art. After a Zn diffusion on the p-type side, the wafer was thinned to approximately 100 $\mu$m, and Au-Pt-Au and Au-Sn metal contacts were alloyed to the p- and n-type sides, respectively. An additional Au pad was plated on the p-type side to allow bonding of contacts. Variations in the described structure will be readily thought of by those skilled in the art. Other stripe geometry lasers, such as a proton bombarded stripe laser or an oxide stripe laser, may be used.

Figure 3:
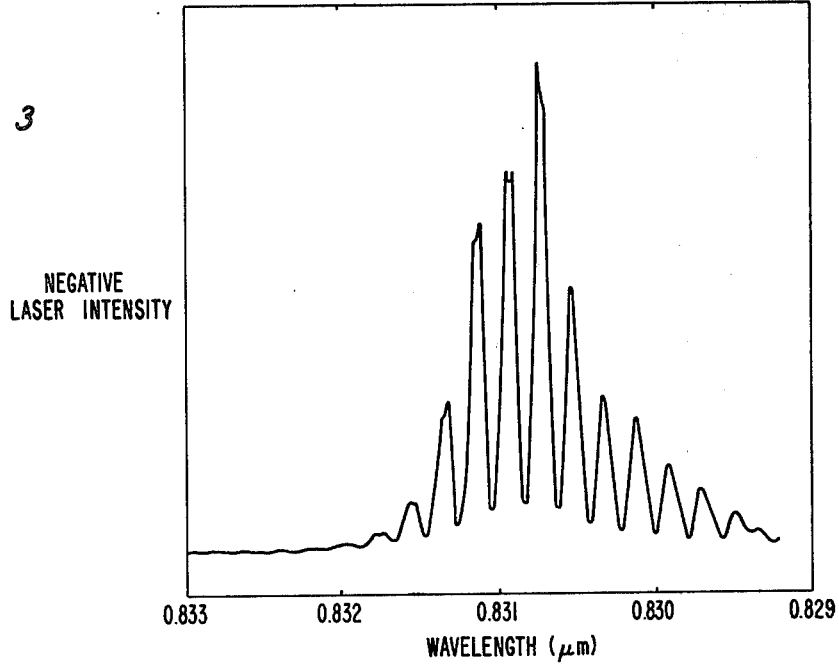
FIG. 3 is the optical spectrum of the emission from a passively mode locked laser of this invention.

The optical spectrum of the emission from a passively mode locked laser of this invention is shown in FIG. 3. The wavelength of the emitted radiation is plotted horizontally in units of $\mu$m, and the intensity of the radiation is plotted vertically in arbitrary units. The optical spectrum consists of several Fabry-Perot modes which result from the residual reflectivity of the antireflection coated laser facet of the laser cavity. The mode spacing is approximately 2.1 Angstroms, and the corresponding round-trip transit time through the laser is approximately 11 ps. The Fabry-Perot modes are broadened by approximately 0.4 Angstroms. This broadening results from a shift of the modes to longer wavelengths during the emission of the pulse, which results from the increase in the carrier-dependent refractive index. The increase in dielectric constant increases the round-trip transit time through the laser by the time $\Delta Y = Y_L (\Delta\lambda/\lambda)(1 - \lambda\Delta/n\Delta\lambda)$. The transit time, using a typical value for the dispersion factor, is increased by approximately $6.6 \times 10^{-4}$ ps, which is negligible as compared to the pulse width.

The pulse widths were measured with a nonlinear autocorrelator using phase matched second harmonic generation in a $LiIO_3$ crystal. This method is described in *Journal of Applied Physics,* 51, pp. 3033-3037, 1980. The two beams of the autocorrelator were spatially separated and recombined at the focal point within the $LiIO_3$ crystal. The selection of the central harmonic beam by an aperture in front of the phototube allowed detection of the harmonic intensity because of the overlap of the two incident fundamental beams.

The second harmonic autocorrelation as a function of delay time of one of the beams is shown in FIG. 4. The autocorrelation consists of a series of peaks of 1 psec full width at half maximum (FWHM). If it is assumed that the pulse intensity has a $sech^2$ shape, the laser pulses have a 0.65 psec FWHM. The multiple pulses result from the reflection of part of the pulse at the AR coated facet, and its subsequent amplification by the gain medium and pulse shaping by the saturable absorber. This process continues until the gain medium is exhausted and the pulse train has left the active medium. The autocorrelation at zero delay in FIG. 4 is the sum of the selfcorrelations of the pulses. The additional peaks at multiples of the 11 psec round-trip transit delay time are the sum of the correlations of pulses which are separated by this time interval. The correlations have identical widths indicating the pulse widths are equal. By varying the length of the external cavity, subpicosecond pulses were obtained with repetition rates between 0.6 to 2.7 GHz. The upper frequency is the short cavity limit determined by the length of the collimating objective and is not a fundamental mental limitation on the repetition rate.

The time dependence of the emission is the Fourier transform of the optical spectrum. The multiple pulse behavior is explained by the incomplete filling of the optical spectrum. The short pulses result from the interference of coherent waves.

The full width at half maximum of the envelope of the pulse intensity is estimated as approximately 20 psec. The corresponding spectral width of a Fabry-Perot mode, after deconvolution of the mode shift and the resolution of the spectrometer, is approximately 0.4 Angstroms. This width corresponds to approximately 17 modes of the composite cavity.

The results clearly indicate that the modes over the entire mode spectrum are locked. This differs from previous mode locking experiments where only modes of the composite cavity corresponding to the Fabry-Perot mode groups of the laser were locked, and the composite cavity modes of different Fabry-Perot mode groups were not locked. The lack of a coherent phase relationship between mode groups produces sharp spikes in the autocorrelation separated by the round-trip transit time through the laser and which are superimposed on the broad peak.

The coherence between the mode groups is responsible for the subpicosecond transform-limited pulses. The coherence of these modes is evident from the absence of a broad underlying band and the autocorrelation data, as well as the remarkable enhancement, by approximately an order of magnitude, in the second harmonic intensity.

Modifications of the specific embodiment described are contemplated. For example, the active layer may comprise InGaAsP if longer wavelength radiation is desired, as may the cladding layers. Furthermore, a Fabry-Perot etalon may be inserted into the cavity to limit the spectral width to a single laser mode group. Additionally, techniques other than proton bombardment, which produce saturable loss may be used. For example, bombardment of the device with an oxygen beam may be used.

What is claimed is:

1. A semiconductor laser having an active layer, first and second cladding layers on opposed surfaces of said active layer, characterized in that said active layer further comprises a saturable absorption region, said saturable absorber region being a proton bombarded region.

2. A semiconductor layer as recited in claim 1 in which said proton bombarded region is adjacent an exit face of said active layer.

3. A semiconductor laser is recited in claim 2 in which said proton bombarded region is at a dosage level of at least $3 \times 10^{15}$ cm$^{-2}$.

4. A semiconductor laser as recited in claim 3 in which said proton bombarded region is at a dosage level less than $10^{16}$ cm$^{-2}$.

5. A semiconductor laser as recited in claim 4 in which said saturable absorption region has a length between 6 $\mu$m and 50 $\mu$m.

6. A semiconductor laser as recited in claim 5 in which said laser further comprises an external cavity.

7. A semiconductor laser as recited in claim 6 in which said external cavity comprises a mirror and a lens.

8. A semiconductor laser as recited in claim 7 in which said mirror and said lens are optically coupled by an optical fiber, said mirror and lens forming an integral part of said fiber.

9. A semiconductor laser as recited in claim 5 or 8 in which said active layer comprises $Al_xGa_{1-x}As$, x is less than or equal to approximately 0.08.

* * * * *